United States Patent
Tai et al.

(10) Patent No.: US 11,703,539 B2
(45) Date of Patent: Jul. 18, 2023

(54) MANUFACTURING METHOD OF ELECTRONIC DEVICE AND ELECTRONIC DEVICE

(71) Applicant: Innolux Corporation, Miao-Li County (TW)

(72) Inventors: Ming-Jou Tai, Miao-Li County (TW); Chia-Hao Tsai, Miao-Li County (TW); Yi-Shiuan Cherng, Miao-Li County (TW); Youcheng Lu, Miao-Li County (TW)

(73) Assignee: Innolux Corporation, Miao-Li County (TW)

( * ) Notice: Subject to any disclaimer, the term of this patent is extended or adjusted under 35 U.S.C. 154(b) by 88 days.

(21) Appl. No.: 17/092,331

(22) Filed: Nov. 9, 2020

(65) Prior Publication Data
US 2021/0173000 A1 Jun. 10, 2021

Related U.S. Application Data

(60) Provisional application No. 62/944,375, filed on Dec. 6, 2019.

(30) Foreign Application Priority Data

Aug. 13, 2020 (CN) .......................... 202010811286.7

(51) Int. Cl.
*G01R 31/28* (2006.01)
*H04B 3/46* (2015.01)

(52) U.S. Cl.
CPC ..... *G01R 31/2841* (2013.01); *G01R 31/2843* (2013.01); *H04B 3/46* (2013.01)

(58) Field of Classification Search
CPC .............. G01R 31/2635; G01R 31/265; G01R 31/3025; G01R 31/312; G01R 31/31723;
(Continued)

(56) References Cited

U.S. PATENT DOCUMENTS 5,546,013 A * 8/1996 Ichioka .................. G09G 3/006
324/760.02
7,091,738 B2 * 8/2006 Nakano .................. G09G 3/006
324/760.02
(Continued)

FOREIGN PATENT DOCUMENTS

| CN | 105590572 | 5/2016 |
| CN | 106291999 | 1/2017 |
| CN | 209232376 | 8/2019 |

OTHER PUBLICATIONS

"Office Action of Taiwan Counterpart Application", dated Jun. 16, 2021, p. 1-p. 8.
(Continued)

*Primary Examiner* — Vinh P Nguyen
(74) *Attorney, Agent, or Firm* — JCIPRNET

(57) ABSTRACT

A manufacturing method of an electronic device and an electronic device are provided. The manufacturing method includes the following steps: providing a substrate; forming a plurality of signal lines and a testing circuit on the substrate, wherein the testing circuit includes a plurality of output channels electrically connected to at least a portion of the plurality of signal lines; performing a testing process; and optionally isolating the testing circuit from the at least a portion of the plurality of signal lines. The testing process includes: providing a signal; processing a plurality of testing signals by processing the signal via the testing circuit; and transmitting the plurality of testing signals to the at least a portion of the plurality of signal lines via the plurality of output channels. The plurality of output channels are less than the plurality of signal lines in quantity.

20 Claims, 8 Drawing Sheets

(58) Field of Classification Search
CPC ............ G01R 31/2841; G01R 31/2843; G01R 31/31705; G01R 31/318385; G01R 31/318566; G01R 31/318572; G01R 31/00; H01L 2933/0033; H01L 2933/0016; H01L 33/36; H01L 21/67242; H01L 22/14; H01L 22/34; H01L 27/3244; H04B 3/46; G09G 3/006; G09G 2330/12; G09G 3/3648; G09G 3/3233; G09G 3/36; G09G 2300/0408; G09G 2300/0814; G09G 2320/029; G09G 2330/08
See application file for complete search history.

(56) References Cited

U.S. PATENT DOCUMENTS

| | | | | | |
|---|---|---|---|---|---|
| 7,821,285 | B2* | 10/2010 | Kawaura | ............... | G09G 3/006 324/760.01 |
| 7,956,946 | B2* | 6/2011 | Yang | ............... | G09G 3/006 349/40 |
| 8,542,028 | B2* | 9/2013 | Ishii | ............... | G09G 3/006 324/760.02 |
| 8,749,457 | B2* | 6/2014 | Segawa | ............... | G09G 3/006 345/82 |
| 9,575,213 | B2* | 2/2017 | Nagaya | ............... | G02B 5/223 |
| 9,595,213 | B2* | 3/2017 | Kim | ............... | G09G 3/3225 |
| 10,775,953 | B2* | 9/2020 | Yeh | ............... | G06F 3/04164 |
| 11,308,837 | B2* | 4/2022 | Ban | ............... | G09G 3/3233 |
| 2016/0104402 | A1* | 4/2016 | Kim | ............... | G09G 3/006 324/762.07 |

OTHER PUBLICATIONS

"Office Action of China Counterpart Application", dated Apr. 24, 2022, p. 1-p. 8.

* cited by examiner

MANUFACTURING METHOD OF ELECTRONIC DEVICE AND ELECTRONIC DEVICE

CROSS-REFERENCE TO RELATED APPLICATION

This application claims the priority benefits of U.S. provisional application Ser. No. 62/944,375, filed on Dec. 6, 2019, and China application serial no. 202010811286.7, filed on Aug. 13, 2020. The entirety of each of the above-mentioned patent applications is hereby incorporated by reference herein and made a part of this specification.

BACKGROUND

Field of the Disclosure

The disclosure relates to a manufacturing method, and more particularly to a manufacturing method of an electronic device and an electronic device.

Description of Related Art

For a display panel with high pixel resolution (pixels per inch, PPI), due to the larger number of pixel units, there may not be enough space in the peripheral area of the display panel for an array of testing circuit, or the peripheral area of the display panel needs more layout area for the array of testing circuit, so it is difficult for the display panel with high pixel resolution to achieve the effect of narrow frame.

SUMMARY

In view of this, the disclosure provides a manufacturing method of an electronic device and an electronic device that may form a testing circuit on a substrate of the electronic device.

According to an embodiment of the disclosure, the manufacturing method of the electronic device of the disclosure includes the following steps: providing a substrate; forming a plurality of signal lines and a testing circuit on the substrate, wherein the testing circuit includes a plurality of output channels electrically connected to at least a portion of the plurality of signal lines; performing a testing process; and optionally isolating the testing circuit from the at least a portion of the plurality of signal lines. The testing process includes: providing a signal; processing a plurality of testing signals by processing the signal via the testing circuit; and transmitting the plurality of testing signals to the at least a portion of the plurality of signal lines via the plurality of output channels. The plurality of output channels are less than the plurality of signal lines in quantity.

According to an embodiment of the disclosure, the electronic device of the disclosure includes a plurality of signal lines and a testing circuit. The testing circuit includes a plurality of output channels. The plurality of output channels are less than the plurality of signal lines in quantity.

Based on the above, the manufacturing method of the electronic device and the electronic device of the disclosure may transmit a testing signal to a plurality of signal lines via output channels which are less than signal lines in quantity, in order to achieve the effect of reducing the layout area needed for the testing circuit on the substrate, and to effectively perform testing.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1A:
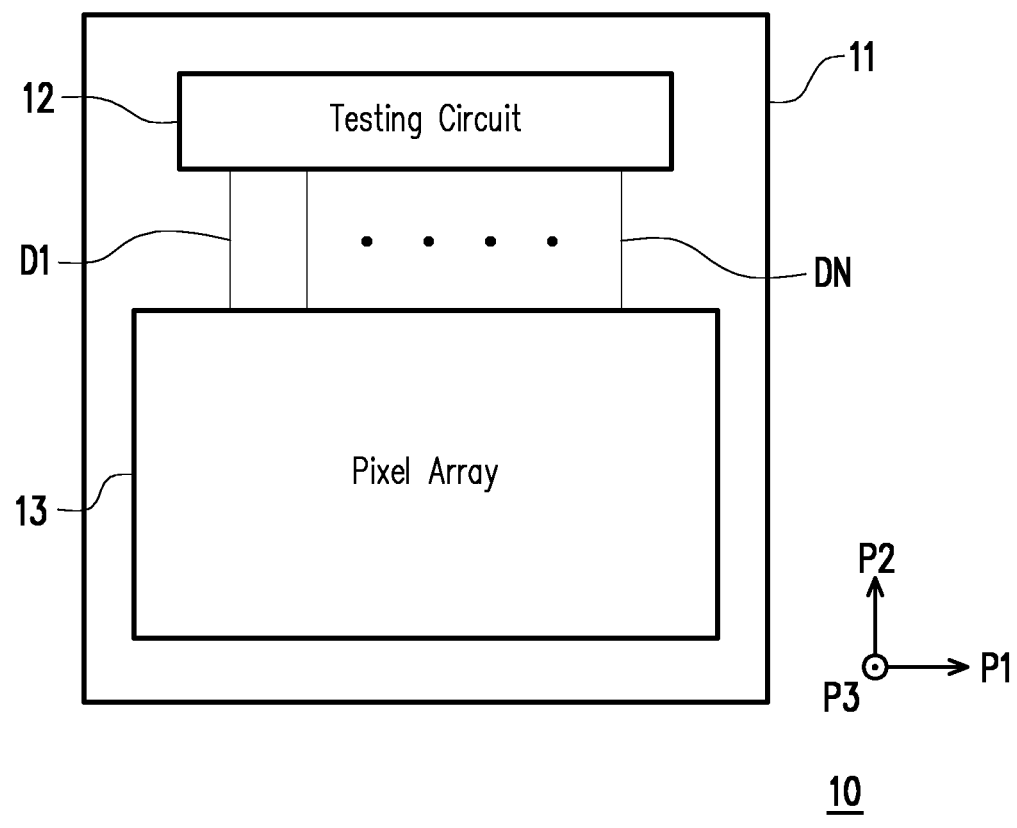
FIG. 1A is a diagram of an electronic device of the first embodiment of the disclosure.

Throughout the disclosure, certain words are used to refer to specific elements in the specification and the claims. Those skilled in the art should understand that electronic device manufacturers may refer to the same components by different names. The present specification does not intend to distinguish between components that have the same function but different names. In the following specification and the claims, words such as "containing" and "including" are open-ended words, so they should be interpreted as meaning "containing/including but not limited to . . . "

In the present specification, wordings used to indicate direction, such as "up," "down," "front," "back," "left," and "right", merely refer to directions in the drawings. Therefore, the directional terms are used to illustrate and are not intended to limit the disclosure. In the drawings, the figures depict typical features of the methods, structures, and/or materials used in the particular embodiments. However, the figures are not to be interpreted as defining or limiting the scope or nature of the embodiments. For example, the relative size, thickness, and location of layers, regions, and/or structures may be reduced or enlarged for clarity.

In some embodiments of the disclosure, terms such as "connection", "interconnection", etc. regarding joining and connection, unless specifically defined, may mean that two structures are in direct contact, or that two structures are not in direct contact, wherein there are other structures located between these two structures. Moreover, terms related to joining and connecting may also include the case where both structures are movable or both structures are fixed. In addition, the term "electrical connection" includes any direct and indirect electrical connection means.

The ordinal numbers used in the specification and claims, such as "first", "second", etc., are used to modify an element. They do not themselves imply and represent that the element(s) have any previous ordinal number, and also do not represent the order of one element and another element, or the order of manufacturing methods. The use of these ordinal numbers is to clearly distinguish an element with a certain name from another element with the same name. The claims and the specification may not use the same terms, and accordingly, the first component in the specification may be the second component in the claims. It should be noted that the following embodiments may replace, recombine, and mix the technical features of several different embodiments without departing from the spirit of the disclosure to complete other embodiments.

In the embodiments of the disclosure, the electronic device includes a display device, an antenna device, a sensing device, or a tiling device, but is not limited thereto. The electronic device may be a bendable or flexible electronic device. The display panel of the display device may include, for example, liquid crystal, light-emitting diode, quantum dot (QD), fluorescence, phosphor, other suitable materials, or a combination of the above materials, but is not limited thereto. The light-emitting diode may include, for example, an organic light-emitting diode (OLED), a mini LED, a micro LED, or a quantum dot light-emitting diode (QLED or QDLED), fluorescence, phosphor, or other suitable materials, and the materials may be arranged and combined arbitrarily, but the disclosure is not limited thereto. The antenna device may be, for example, a liquid crystal antenna device, but is not limited thereto. The tiling device may be, for example, a display tiling device or an antenna tiling device, but is not limited thereto. It should be noted that the electronic device may be any arrangement and combination of the above, but is not limited thereto.

In the various embodiments of the disclosure, the substrate may be a rigid substrate or a flexible substrate. The material of the substrate may include, for example, metal, plastic, glass, quartz, sapphire, ceramic, carbon fiber, other suitable substrate materials, or a combination of the foregoing, but the disclosure is not limited thereto.

FIG. 1A is a diagram of the electronic device of the first embodiment of the disclosure. Referring to FIG. 1A, an electronic device 10 includes a testing circuit 12, a plurality of signal lines D1 to DN, and a pixel array 13, wherein N is a positive integer. The testing circuit 12, the plurality of signal lines D1 to DN, and the pixel array 13 are formed on a substrate 11. The testing circuit 12 may be an array of testing circuit. The testing circuit includes a plurality of output channels, and at least a portion of the plurality of output channels are electrically connected to a plurality of signal lines. The substrate 11 is, for example, parallel to a plane formed by extending a direction P1 and a direction P2, wherein directions P1 to P3 are perpendicular to each other. In the present embodiment, the testing circuit 12 is electrically connected to a plurality of pixel units of the pixel array 13 via the signal lines D1 to DN, wherein the signal lines D1 to DN may be electrically connected to a plurality of data lines in the pixel array 13, for example. The testing circuit 12 may output a plurality of testing signals to the plurality of pixel units of the pixel array 13 via the plurality of signal lines to test whether the plurality of signal lines are shortage or disconnected. In the present embodiment, the substrate 11 may be a substrate of a display panel. The pixel array 13 corresponds to the active area (AA) of the display panel, and may provide a display image in the direction P3. The testing circuit 12 may be formed in the upper frame area or the lower frame area of the substrate of the display panel, and is not limited to that shown in FIG. 1A. It is worth noting that, in an embodiment, after the testing process is completed, the testing circuit 12 may be disabled and remain on the substrate 11 of the electronic device 10. Alternatively, in another embodiment, after testing process is completed, a portion of the substrate 11 forming the testing circuit 12 may also be cut off to remove the testing circuit 12. In other words, after testing process is completed, the testing circuit 12 may optionally isolate at least a portion of the signal lines D1 to DN.

Figure 1B:
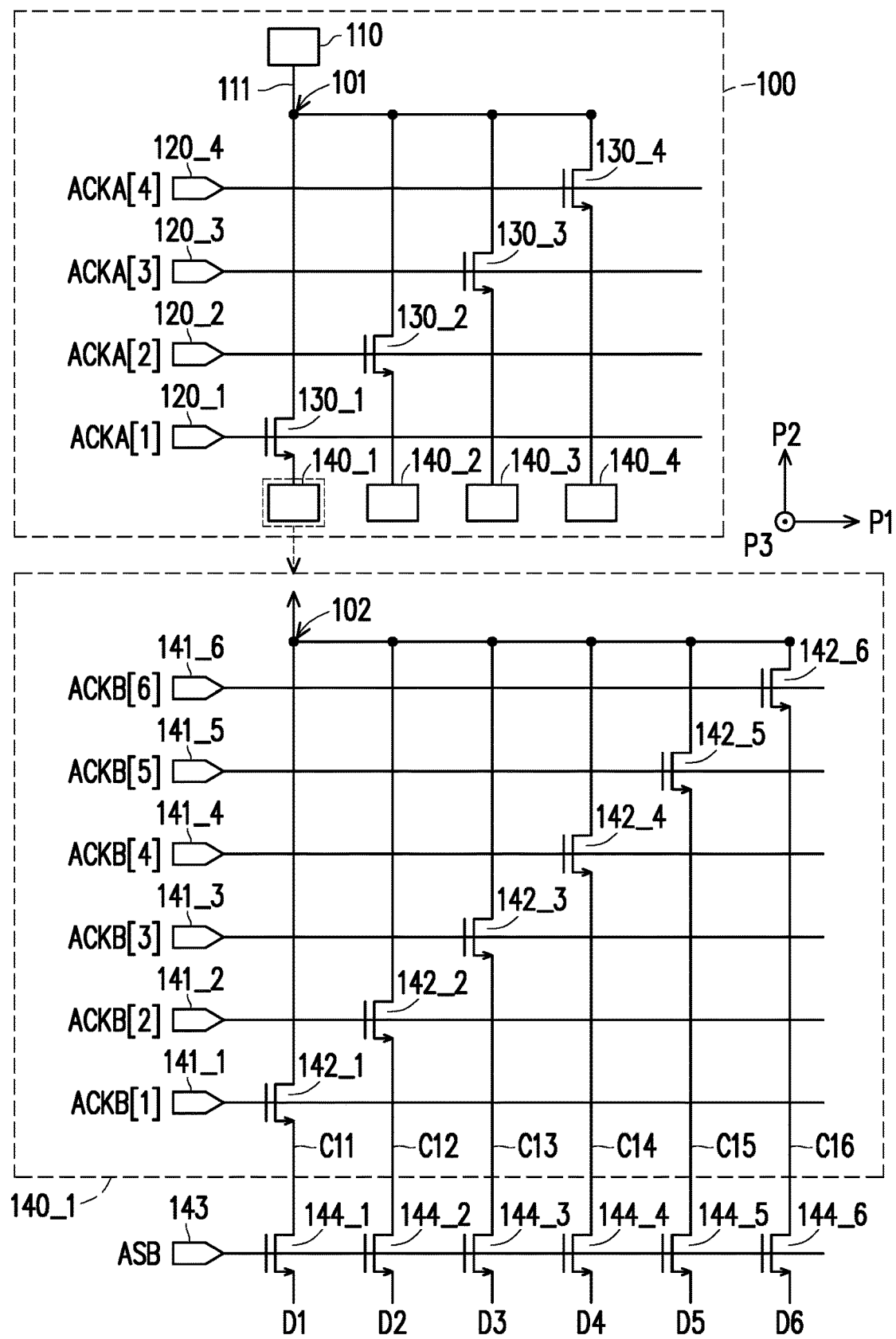
FIG. 1B is a circuit diagram of a testing circuit and an isolation circuit of the first embodiment of the disclosure.

FIG. 1B is a circuit diagram of a testing circuit 100 and an isolation circuit of the first embodiment of the disclosure. At least a portion of the testing circuit 12 of FIG. 1A may include, for example, a testing circuit 100 shown in FIG. 1B and an isolation circuit which is between the testing circuit and the plurality signal lines. Referring to FIG. 1B, the testing circuit 100 may include a signal source 110, a plurality of first control signal input terminals 120_1 to 120_4, a plurality of first switches 130_1 to 130_4, and a plurality of sub-testing circuits 140_1 to 140_4. The sub-testing circuit 140_1 includes a plurality of second control signal input terminals 141_1 to 141_6, a plurality of second switches 142_1 to 142_6, and a plurality of output channels C11 to C16. The output channels C11 to C16 are electrically connected to signal lines D1 to D6 via the third switches 144_1 to 144_6. Furthermore, the sub-testing circuits 140_2 to 140_4 may have the same circuit architecture as the sub-testing circuit 140_1. Referring to FIG. 1B, the isolation circuit may include a third control signal input terminal 143, a plurality of third switches 144_1 to 144_6. It should be noted that the first switch, the second switch, and the third switch of the disclosure may be N-type transistors, but the disclosure is not limited thereto. In an embodiment, the first switch, the second switch, and the third switch may also be P-type transistors or other types of switching circuits.

In the present embodiment, the first control signal input terminals 120_1 to 120_4 are electrically connected to the control terminals of the first switches 130_1 to 130_4 one-to-one, respectively. A plurality of first ends of the first switches 130_1 to 130_4 are electrically connected to the signal source 110 in common via a circuit node 101. The signal source 110 may provide a signal 111 to the circuit node 101, and the testing circuit 100 may process the signal 111 to form a plurality of testing signals, wherein the testing circuit 100 may generate and output a plurality of testing signals according to the signal 111 by controlling the switching states of the first switches 130_1 to 130_4 and the second switches 142_1 to 142_6. In the present embodiment, a plurality of second ends of the first switches 130_1 to 130_4 are electrically connected to the sub-testing circuits 140_1 to 140_4 one-to-one, respectively. In the present embodiment, the first control signal input terminals 120_1 to 120_4 may receive a plurality of control signals ACKA[1] to [4] from a control circuit (not shown), and respectively provide the control signals ACKA[1] to [4] to a plurality of control terminals of the first switches 130_1 to 130_4 to control the first switches 130_1 to 130_4 to be on or off.

In the present embodiment, the second control signal input terminals 141_1 to 141_6 of the sub-testing circuit 140_1 are electrically connected to the control terminals of the second switches 142_1 to 142_6 one-to-one, respectively. A plurality of first ends of the second switches 142_1 to 142_6 are electrically connected to the second ends of the first switches 130_1 to 130_6 in common via a circuit node 102. A plurality of second ends of the second switches 142_1 to 142_6 are electrically connected to the first ends of the third switches 144_1 to 144_6 via the output channels C11 to C16, respectively. The third control signal input terminal 143 of the isolation circuit is electrically connected to the control terminals of the third switches 144_1 to 144_6. The second ends of the third switches 144_1 to 144_6 are electrically connected to the signal lines D1 to D6. In the present embodiment, the second control signal input terminals 141_1 to 141_6 may receive a plurality of control signals ACKB[1] to [6] from the control circuit, and respectively provide the control signals ACKB[1] to [6] to a plurality of control terminals of the second switches 142_1 to 142_6 to control the second switches 142_1 to 142_6 to be on or off. In addition, the third control signal input terminal 143 may receive a control signal ASB from the control circuit, and provide the control signal ASB to a plurality of control terminals of the third switches 144_1 to 144_6 to control the third switches 144_1 to 144_6 to be on or off.

Figure 2:
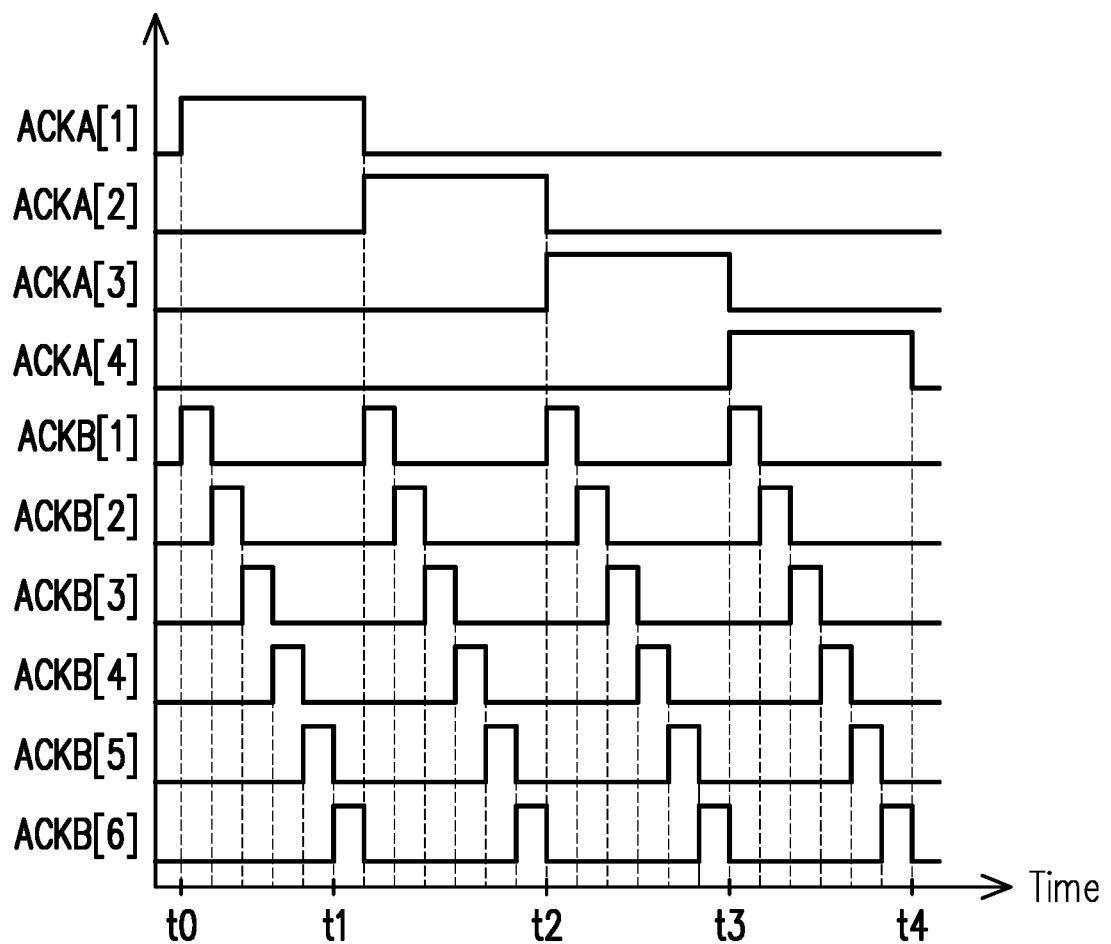
FIG. 2 is a timing diagram of a plurality of control signals of a testing circuit of an embodiment of the disclosure.

FIG. 2 is a timing diagram of a plurality of control signals of a testing circuit of an embodiment of the disclosure. Referring to FIG. 1B and FIG. 2, the testing circuit 100 may perform a testing process. In the present embodiment, first, the control terminals of the third switches 144_1 to 144_6 may receive the control signal ASB, so that they are all turned on during the testing process. Then, the first control signal input terminals 120_1 to 120_4 receive the control signals ACKA[1] to [4]. The first switch 130_1 may be turned on during times t0 to t1, and turned off during the rest of the time. The first switch 130_2 may be turned on during times t1 to t2, and be turned off during the rest of the time. The first switch 130_3 may be turned on during times t2 to t3, and be turned off during the rest of the time. The first switch 130_4 may be turned on during times t3 to t4, and be turned off during the rest of the time. Moreover, the second control signal input terminals 141_1 to 141_6 receive the control signals ACKB[1] to [6]. The second switches 142_1 to 142_6 may be sequentially turned on during each period. For example, the control signals ACKB[1] to [6] may sequentially provide control signals of a plurality of control signal waveforms having high electrical level during the period of times t0 to t1, and the plurality of control signal waveforms having high electrical level are not overlapped with each other in timing.

Therefore, during the times t0 to t1, the first switch 130_1 may provide a testing signal to the sub-testing circuit 140_1 according to the signal 111 provided by the circuit node 101, and the second switches 142_1 to 142_6 of the sub-testing circuit 140_1 may be sequentially turned on to sequentially output the testing signals to the output channels C11 to C16. Moreover, because the third switches 144_1 to 144_6 are turned on during the testing process, the sub-testing circuit 140_1 may sequentially transmit a plurality of testing signals to the signal lines D1 to D6 via the output channels C11 to C16 in a time-sharing manner. During the period from times t1 to t4, the sub-testing circuits 140_2 to 140_4 may perform the same operation as the sub-testing circuit 140_1. In other words, the testing circuit 100 of the present embodiment may transmit a plurality of testing signals to all signal lines via a plurality of output channels, so as to effectively test whether the plurality of signal lines are shortage or disconnected.

It is worth noting that after the testing process is ended (for example, after the time t4), the control terminals of the third switches 144_1 to 144_6 may receive the control signal ASB and be switched off, so that the testing circuit 100 may be (electrically) isolated from the signal lines D1 to D6. In other words, the third switches 144_1 to 144_6 may be used as isolation circuits and may be enabled to isolate the testing circuit 100 from the signal lines D1 to D6.

Figure 3:
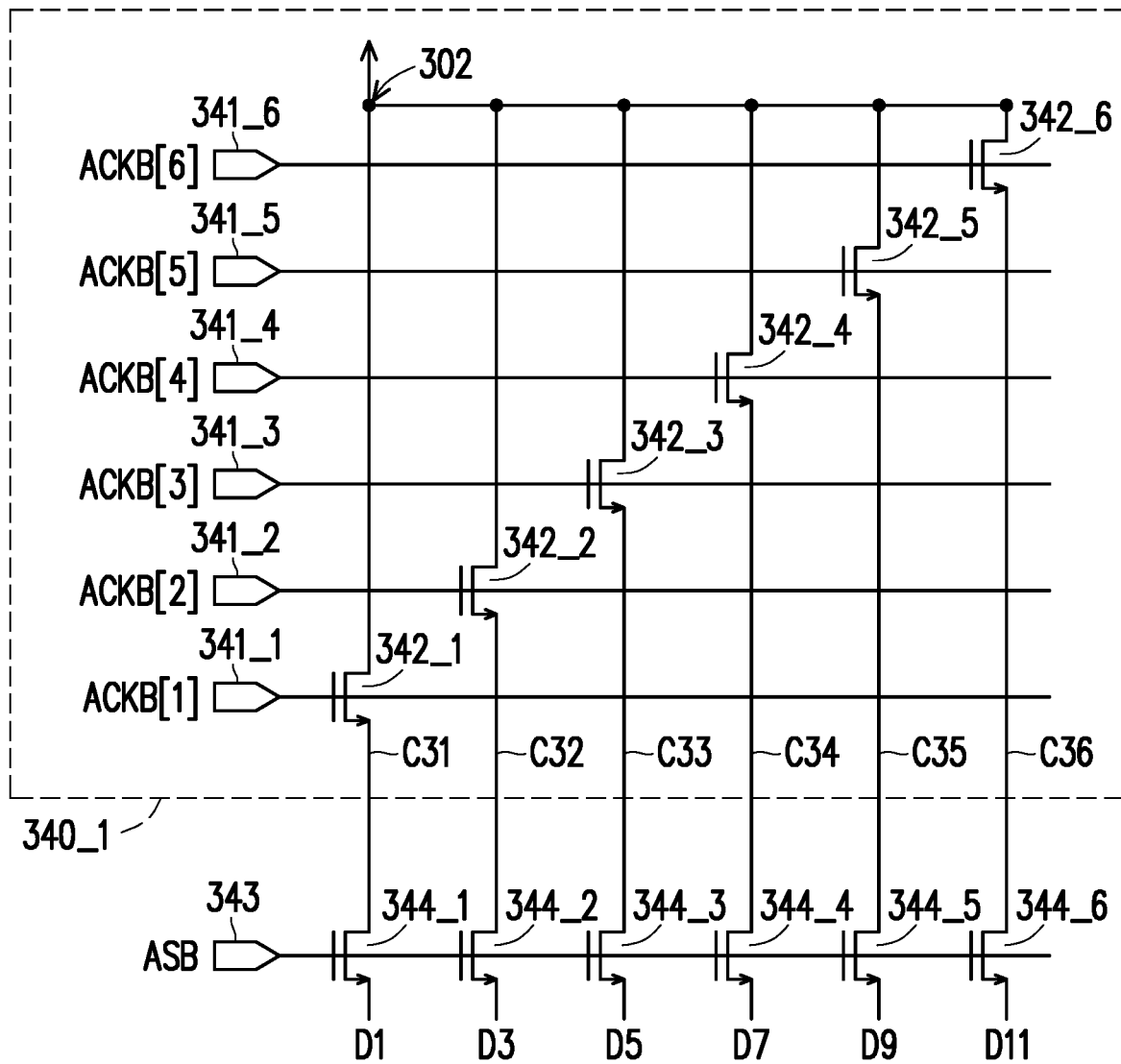
FIG. 3 is a circuit diagram of a sub-testing circuit of the second embodiment of the disclosure.
Figure 3:
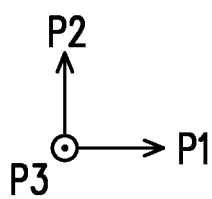

FIG. 3 is a circuit diagram of a sub-testing circuit of the second embodiment of the disclosure. Referring to FIG. 1B and FIG. 3, the sub-testing circuit 140_1 of FIG. 1B may also implement a sub-testing circuit 340_1 of FIG. 3. In the present embodiment, the sub-testing circuit 340_1 includes a plurality of second control signal input terminals 341_1 to 341_6, a plurality of second switches 342_1 to 342_6, and a plurality of output channels C31 to C36. The isolation circuit may include a third control signal input terminal 343 and a plurality of third switches 344_1 to 344_6. It is worth noting that the output channels C31 to C36 of the present embodiment are sequentially electrically connected to a first signal line D1 in sequence, a third signal line D3 in sequence, a fifth signal line D5 in sequence, a seventh signal line D7 in sequence, a ninth signal line D9 in sequence, and an eleventh signal line D11 in sequence of the signal lines via the third switches 344_1 to 344_6. Furthermore, the sub-testing circuits 340_2 to 340_4 may have the same circuit architecture as the sub-testing circuit 340_1.

In the present embodiment, the second control signal input terminals 341_1 to 341_6 of the sub-testing circuit 340_1 are electrically connected to the control terminals of the second switches 342_1 to 342_6 one-to-one, respectively. A plurality of first ends of the second switches 342_1 to 342_6 are electrically connected to the second end of the first switch 130_1 in common via a circuit node 302. A plurality of second ends of the second switches 342_1 to 342_6 are electrically connected to the first ends of the third switches 344_1 to 344_6 via the output channels C31 to C36, respectively. The third control signal input terminal 343 of the isolation circuit is electrically connected to the control terminals of the third switches 344_1 to 344_6. The second ends of the third switches 344_1 to 344_6 are sequentially and electrically connected to the first signal line D1, the third signal line D3, the fifth signal line D5, the seventh signal line D7 in, the ninth signal line D9, and the eleventh signal line D11 in sequence of the signal lines. In the present embodiment, the second control signal input terminals 341_1 to 341_6 may receive the plurality of control signals ACKB[1] to [6] from the control circuit, and respectively provide the control signals ACKB[1] to [6] to a plurality of control terminals of the second switches 342_1 to 342_6 to control the second switches 342_1 to 342_6 to be on or off. In addition, the third control signal input terminal 343 may receive the control signal ASB from the control circuit, and provide the control signal ASB to a plurality of control terminals of the third switches 344_1 to 344_6 to control the third switches 344_1 to 344_6 to be on or off.

In the present embodiment, the sub-testing circuit 340_1 may also be applied to the plurality of control signal according to timing diagram of FIG. 2 to perform a testing process similar to that in the embodiments of FIG. 1B and FIG. 2. Therefore, the same or similar implementation content of the testing process is not repeated herein. Details of the switch operation of the sub-testing circuit 340_1 is provided below. In the present embodiment, since the sub-testing circuit 340_1 is electrically connected to odd-numbered signal lines in sequence, the overall output channels of the testing circuit 100 are less than the overall signal lines in quantity. In other words, the testing circuit 100 may transmit a plurality of testing signals to a portion of signal lines via a plurality of output channels. From another perspective, since the testing circuit 100 is electrically connected to odd-numbered signal lines, the total amount of switches of the testing circuit 100 may be reduced. In this regard, the overall layout area of the testing circuit 100 may be effectively reduced, and a plurality of testing signals may still be effectively provided to a plurality of pixel units in the pixel array via the plurality of signal lines. In addition, the sub-testing circuit of the disclosure is not limited to electrically connecting odd-numbered signal lines. In an embodiment, the sub-testing circuit of the disclosure may also be electrically connected to even-numbered signal lines.

Figure 4:
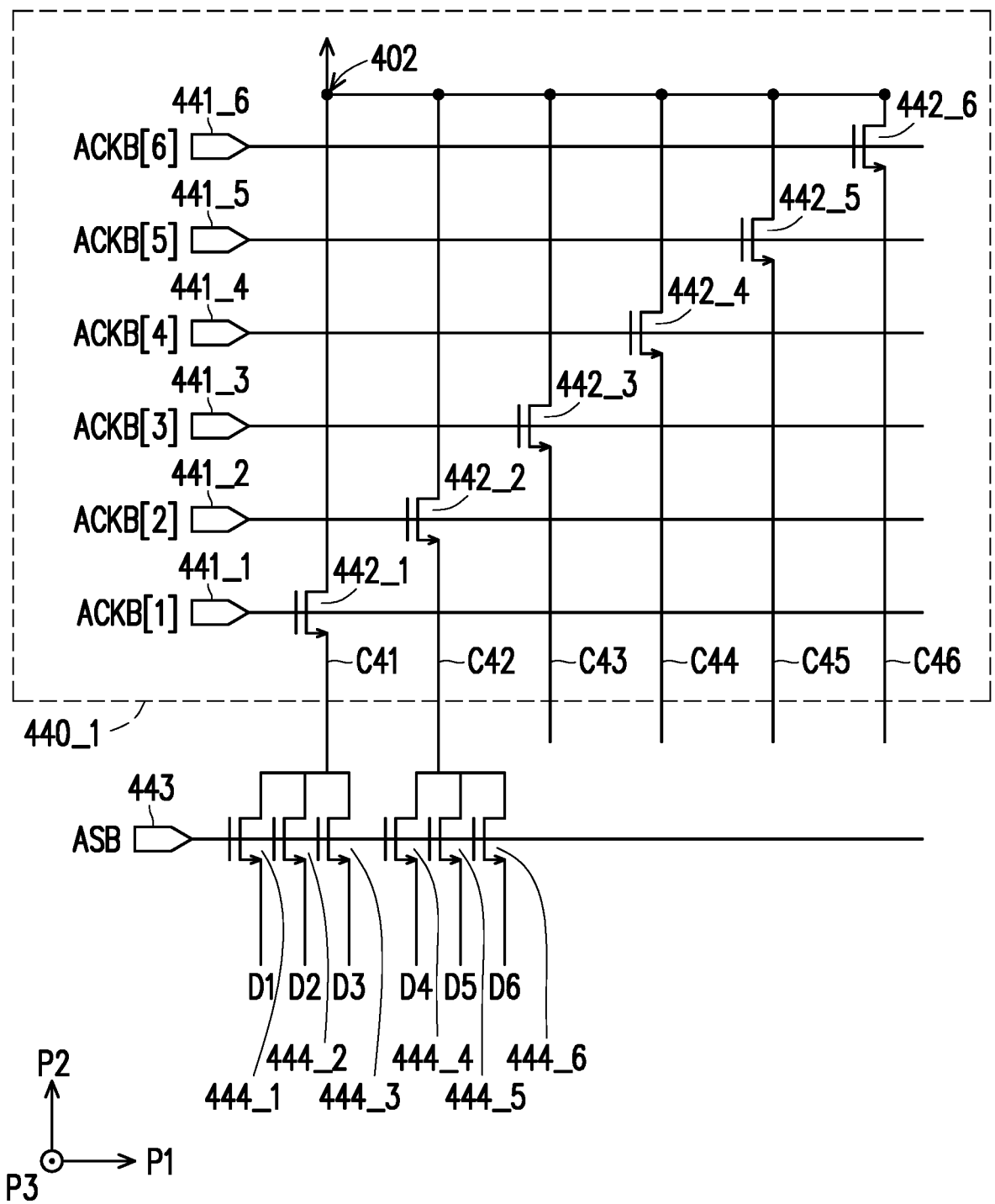
FIG. 4 is a circuit diagram of a sub-testing circuit of the third embodiment of the disclosure.

FIG. 4 is a circuit diagram of a sub-testing circuit of the third embodiment of the disclosure. Referring to FIG. 1B and FIG. 4, the sub-testing circuit 140_1 of FIG. 1B may also implement a sub-testing circuit 440_1 of FIG. 4. In the present embodiment, the sub-testing circuit 440_1 includes a plurality of second control signal input terminals 441_1 to 441_6, a plurality of second switches 442_1 to 442_6, and a plurality of output channels C41 to C46. The isolation circuit may include a third control signal input terminal 443 and a plurality of third switches 444_1 to 444_6. It is worth noting that the output channels C41 to C46 of the present embodiment are respectively electrically connected to three signal lines via three third switches. Furthermore, sub-testing circuits 440_2 to 440_4 may have the same circuit architecture as the sub-testing circuit 440_1.

In the present embodiment, the second control signal input terminals 441_1 to 441_6 of the sub-testing circuit 440_1 are electrically connected to the control terminals of the second switches 442_1 to 442_6 one-to-one, respectively. A plurality of first ends of the second switches 442_1 to 442_6 are electrically connected to the second end of the first switch 130_1 in common via a circuit node 402. A plurality of second ends of the second switches 442_1 to 442_6 are electrically connected to a plurality of third switches via the output channels C41 to C46, respectively. In the present embodiment, the second switch 442_1 may be electrically connected to the first ends of the three third switches 444_1 to 444_3 via the output channel C41, and the second switch 442_2 may be electrically connected to the first ends of the three third switches 444_4 to 444_6 via the output channel C42. The second switches 442_3 to 442_6 may be electrically connected to three third switches (not shown) via the output channels C43 to C46, respectively and so on. The third control signal input terminal 443 of the isolation circuit is electrically connected to the control terminals of the third switches 444_1 to 444_6. The second ends of the third switches 444_1 to 444_6 are electrically connected to the signal lines D1 to D6. In the present embodiment, the second control signal input terminals 441_1 to 441_6 may receive the plurality of control signals ACKB[1] to [6] from the control circuit, and respectively provide the control signals ACKB[1] to [6] to a plurality of control terminals of the second switches 442_1 to 442_6 to control the second switches 442_1 to 442_6 to be on or off. In addition, the third control signal input terminal 443 may receive the control signal ASB from the control circuit, and provide the control signal ASB to a plurality of control terminals of the third switches 444_1 to 444_6 to control the third switches 444_1 to 444_6 to be on or off.

In the present embodiment, the sub-testing circuit 440_1 may also be applied to the plurality of control signal according to timing diagram of FIG. 2 to perform a testing process similar to that in the embodiments of FIG. 1B and FIG. 2. Therefore, the same or similar implementation content of the testing process is not repeated herein. The difference is that since one output channel of the present embodiment may be electrically connected to three third switches, when the second switch 442_1 is turned on, the third switches 444_1 to 444_3 may simultaneously output a plurality of testing signals to the signal lines D1 to D3. When the second switch 442_2 is turned on, the third switches 444_4 to 444_6 may simultaneously output a plurality of testing signals to the signal lines D4 to D6. The three third switches respectively corresponding to the second switches 442_3 to 442_6 and the second switches 442_3 to 442_6 may also perform similar testing signal output operations and so on.

In the present embodiment, since the sub-testing circuit 440_1 may transmit one of the plurality of testing signals to three of the plurality of signal lines via one of the plurality of output channels, and the three of the plurality of signal lines are adjacent to each other and arranged in close proximity in space with no other signal lines in between, and therefore the overall output channels of the testing circuit 100 may be less than the overall signal lines in quantity. In this regard, the overall layout area of the testing circuit 100 may be effectively reduced, and the testing circuit 100 of the present embodiment may transmit a plurality of testing signals to all signal lines via a plurality of output channels, so as to effectively test whether the plurality of signal lines are shortage or disconnected. In addition, the relationship between the number of output channels and signal lines of the disclosure is not limited to that shown in FIG. 4. In an embodiment, one output channel may be electrically connected to any number of a plurality of signal lines via a plurality of third switches.

Figure 5:
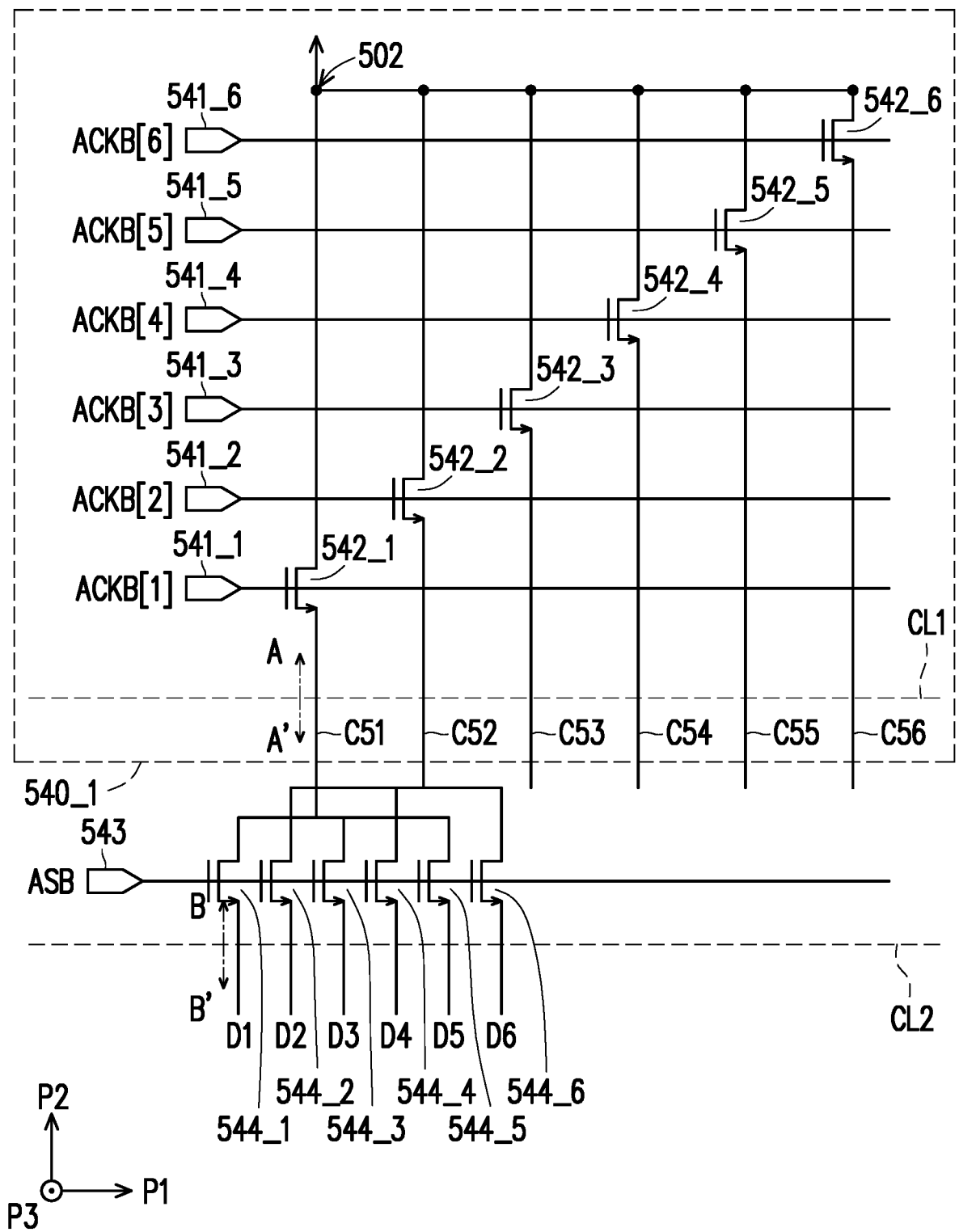
FIG. 5 is a circuit diagram of a sub-testing circuit of the fourth embodiment of the disclosure.

FIG. 5 is a circuit diagram of a sub-testing circuit of the fourth embodiment of the disclosure. Referring to FIG. 1B and FIG. 5, the sub-testing circuit 140_1 of FIG. 1B may also implement a sub-testing circuit 540_1 of FIG. 5. In the present embodiment, the sub-testing circuit 540_1 includes a plurality of second control signal input terminals 541_1 to 541_6, a plurality of second switches 542_1 to 542_6, and a plurality of output channels C51 to C56. The isolation circuit may include a third control signal input terminal 543 and a plurality of third switches 544_1 to 544_6. It is worth noting that the output channels C51 to C56 of the present embodiment are respectively electrically connected to three signal lines via three third switches. Furthermore, sub-testing circuits 540_2 to 540_4 may have the same circuit architecture as the sub-testing circuit 540_1.

In the present embodiment, the second control signal input terminals 541_1 to 541_6 of the sub-testing circuit 540_1 are electrically connected to the control terminals of the second switches 542_1 to 542_6 one-to-one, respectively. A plurality of first ends of the second switches 542_1 to 542_6 are electrically connected to the second end of the first switch 130_1 in common via a circuit node 502. A plurality of second ends of the second switches 542_1 to 542_6 are electrically connected to a plurality of third switches via the output channels C51 to C56, respectively. In the present embodiment, the second switch 542_1 may be electrically connected to the first ends of the three third switches 544_1, 544_3, and 544_5 that are not adjacent to each other via the output channel C51, other third switches are disposed between the third switches 544_1, 544_3, and 544_5, and the second switch 542_2 may be electrically connected to the first ends of the three third switches 544_2, 544_4, and 544_6 via the output channel C52. Each of the second switches 542_3 to 542_6 may be electrically connected to three third switches (not shown) via one of the output channels C53 to C56, respectively and so on. The third control signal input terminal 543 of the isolation circuit is electrically connected to the control terminals of the third switches 544_1 to 544_6. The second ends of the third switches 544_1 to 544_6 are electrically connected to the signal lines D1 to D6. In the present embodiment, the second control signal input terminals 541_1 to 541_6 may receive the plurality of control signals ACKB[1] to [6] from the control circuit, and respectively provide the control signals ACKB[1] to [6] to a plurality of control terminals of the second switches 542_1 to 542_6 to control the second switches 542_1 to 542_6 to be on or off. In addition, the third control signal input terminal 543 may receive the control signal ASB from the control circuit, and provide the control signal ASB to a plurality of control terminals of the third switches 544_1 to 544_6 to control the third switches 544_1 to 544_6 to be on or off.

In the present embodiment, the sub-testing circuit 540_1 may also be applied to the plurality of control signal according to timing diagram of FIG. 2 to perform a testing process similar to that in the embodiments of FIG. 1B and FIG. 2. Therefore, the same or similar implementation content of the testing process is not repeated herein. The difference is that since one output channel of the present embodiment may be electrically connected to three third switches, when the second switch 542_1 is turned on, the third switches 544_1, 544_3, and 544_5 may simultaneously output a plurality of testing signals to the signal lines D1, D3, and D5 not adjacent to each other. When the second switch 542_2 is turned on, the third switches 544_2, 544_4, and 544_6 may simultaneously output a plurality of testing signals to the signal lines D2, D4, and D6 not adjacent to each other, and other signals are disposed between the signal lines D2, D4, and D6. The three third switches respectively corresponding to the second switches 542_3 to 542_6 and the second switches 542_3 to 542_6 may also perform similar testing signal output operations.

In the present embodiment, since the sub-testing circuit 540_1 may transmit one of the plurality of testing signals to three of the plurality of signal lines via one of the plurality of output channels, and the three of the plurality of signal lines are not adjacent to each other, the overall output channels of the testing circuit 100 may be less than the overall signal lines in quantity. In this regard, the overall layout area of the testing circuit 100 may be effectively reduced, and the testing circuit 100 of the present embodiment may transmit a plurality of testing signals to all signal lines via a plurality of output channels, so as to effectively test whether the plurality of signal lines are shortage or disconnected. In addition, the grouping relationship and the number relationship between the output channels and the signal lines of the disclosure are not limited to those shown in FIG. 5. In an embodiment, one output channel may be electrically connected to any number of a plurality of signal lines via a plurality of third switches, and the plurality of signal lines may be spaced apart from each other by any number of other signal lines.

Figure 6:
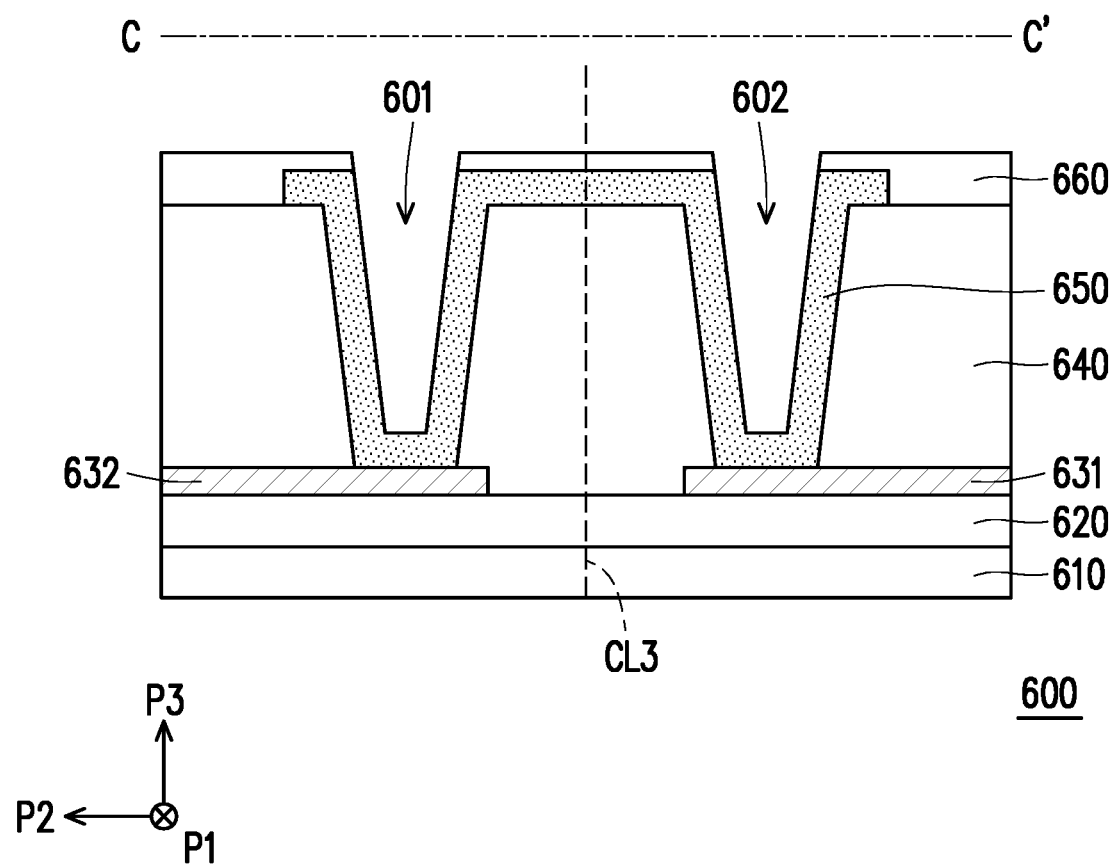
FIG. 6 is a cross-sectional view of a circuit cut-off position of an embodiment of the disclosure.

FIG. 6 is a cross-sectional view of a circuit cut-off position of an embodiment of the disclosure. Referring to FIG. 1B, FIG. 5, and FIG. 6, in the present embodiment, after the testing process is completed, a portion of the testing circuit 100 may be electrically isolated from the at least a portion of the plurality of signal lines. In the present embodiment, a portion of the testing circuit 100 may also be cut off the output channels to disconnect the testing circuit 100 from at least a portion of a plurality of signal lines. In this regard, in the present embodiment, the testing circuit and the at least a portion of the plurality of signal lines are optionally isolated by cutting off the plurality of output channels from the at least a portion of the plurality of signal lines. From the perspective of the sub-testing circuit, as shown in FIG. 5, the output channel of the testing circuit 100 may be removed along a cut-off line CL1 or a cut-off line CL2 of the sub-testing circuit 540_1. In the present embodiment, after the testing process is completed, the testing circuit 100 may be removed along the cut-off line CL1 of the sub-testing circuit 540_1, the third switches 544_1 to 544_6 are retained on the substrate of the electronic device, so that the testing circuit is electrically isolated from the at least a portion of the plurality of signal lines. In an embodiment, after the testing process is completed, the output channel of the testing circuit 100 may be removed along the cut-off line CL2 of the sub-testing circuit 540_1, the third switches 544_1 to 544_6 are removed together, so that the testing circuit is electrically isolated from the at least a portion of the plurality of signal lines. In another embodiment, after the testing process is completed, the testing circuit 100 may be retained on the substrate of the electronic device, and the third switches 544_1 to 544_6 may be operated to be turned off via the control signal ASB, so that the testing circuit is electrically isolated from the at least a portion of the plurality of signal lines.

In the present embodiment, in order to prevent the metal layer of the signal lines from being directly exposed on the cut-off surface, which may cause other interference signals to be transmitted to the pixel array, the position of the signal lines at the cut-off line CL1 or the cut-off line CL2 may prevent the metal layer of the signal lines from being directly exposed at the cut-off surface in a layer-transfer manner. As shown in FIG. 6, a layout structure 600 may be used to present a cross-sectional structure corresponding to the electronic device at cut-off. In the present embodiment, a position C to a position C' of FIG. 6 may correspond to a position A to a position A' or a position B to a position B' of FIG. 5, for example, and a cut-off line CL3 of FIG. 6 may be as the cut-off line CL1 or the cut-off line CL2 of FIG. 5.

In detail, the layout structure 600 includes a substrate 610, a buffer layer 620, metal layers 631 and 632, an insulating layer 640, a conductive material 650, and a planarization layer 660. The buffer layer 620 is formed on the substrate 610, and the metal layers 631 and 632 are formed on the buffer layer 620. The conductive material 650 is, for example, a transparent conductive electrode (ITO). The metal layers 631 and 632 may respectively correspond to the two portions of the traces from the position A to the position A' or the position B to the position B' of FIG. 5, and the metal layers 631 and 632 are not directly electrically connected. The insulating layer 640 is formed on the metal layers 631 and 632 and has via holes 601 and 602 extended to the metal layers 631 and 632 in a direction opposite to the direction P3. The conductive material 650 is formed on the insulating layer 640. The conductive material 650 is, for example, a transparent conductive material and continuously covers the metal layers 631 and 632, wherein the conductive material 650 is connected to the metal layers 631 and 632 along the vias 601 and 602. Therefore, when the layout structure 600 is cut off from the cut-off line CL3, the metal layers 631 and 632 corresponding to the two portions of the signal lines from the position A to the position A' or the position B to the position B' of FIG. 5 are not directly exposed at the cut-off surface, thus effectively preventing interference signals from being transmitted from the metal layer 632 to the pixel array. Each signal line on the cut-off line CL1 or the cut-off line CL2 of FIG. 5 has a similar layout structure design. In addition, in an embodiment, an electrostatic discharge (ESD) unit may be additionally disposed at the position of each trace on the cut-off line CL1 or the cut-off line CL2 of FIG. 5 to increase electrical isolation effect. In addition, FIG. 1B, FIG. 3, and FIG. 4 may also have the cut-off line CL1 or the cut-off line CL2 design as shown in FIG. 5, the layout structure 600 design of FIG. 6 is also applicable to FIG. 1B, FIG. 3, and FIG. 4, and a portion of the substrate forming the testing circuit 100 may also be cut off to optionally isolate the testing circuit 100 from at least a portion of the plurality of signal lines.

Figure 7A:
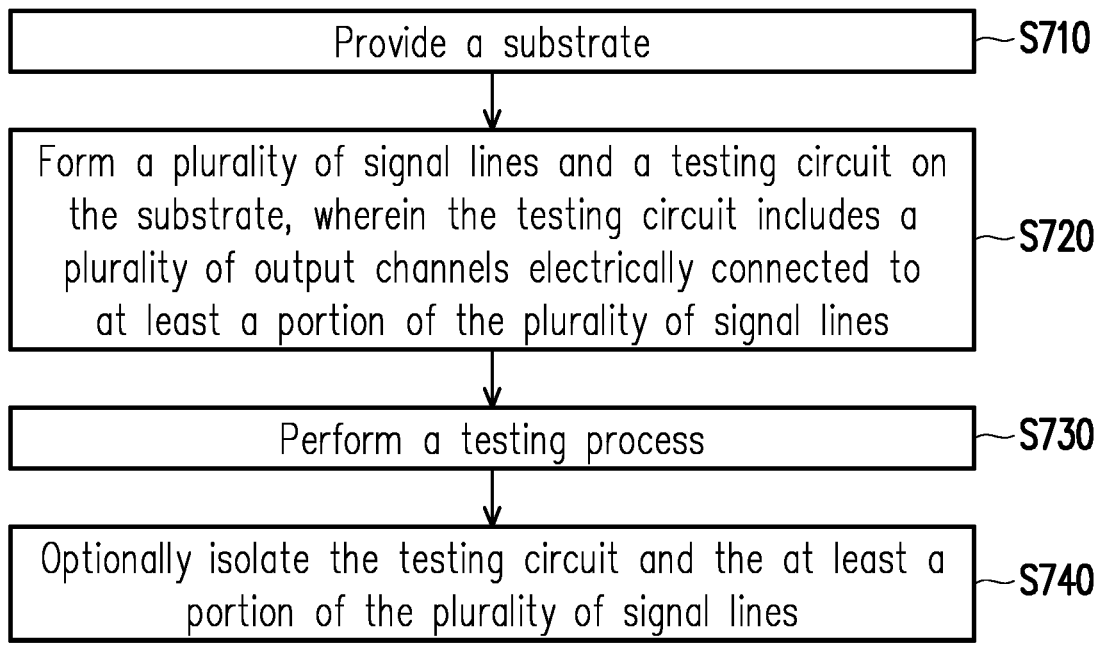
FIG. 7A is a flowchart of a manufacturing method of an embodiment of the disclosure.

FIG. 7A is a flowchart of a manufacturing method of an embodiment of the disclosure. Please refer to FIG. 1A and FIG. 7A. The manufacturing method of the present embodiment is applicable to the electronic device 10 of FIG. 1A. In step S710, the substrate 11 is provided. In step S720, the plurality of signal lines D1 to DN, an isolation circuit and the testing circuit 12 are formed on the substrate 11, wherein the testing circuit 12 includes a plurality of output channels electrically connected to at least a portion of the plurality of signal lines D1 to DN. In this regard, based on the embodiments of FIG. 1B, FIG. 4, and FIG. 5, it may be deduced that the testing circuit 12 may include all of the plurality of output channels electrically connected to the plurality of signal lines D1 to DN. Based on the embodiment of FIG. 3, it may be deduced that the testing circuit 12 may include a portion of the plurality of output channels electrically connected to the plurality of signal lines D1 to DN. In step S730, the electronic device 10 performs a testing process. In step S740, after the testing process is ended, the testing circuit 12 and at least a portion of the plurality of signal lines D1 to DN may be optionally isolated. In the present embodiment, the testing circuit 12 may be disabled and remain on the substrate 11 of the electronic device 10. For example, each of the third switches of FIG. 1B and FIG. 3 to FIG. 5 may be turned off by the control signal ASB. Alternatively, in another embodiment, after testing of the testing circuit 12 is completed, a portion of the testing circuit 12 may also be cut off. Therefore, the manufacturing method of the present embodiment may include performing a testing process on the plurality of signal lines by the testing circuit.

Figure 7B:
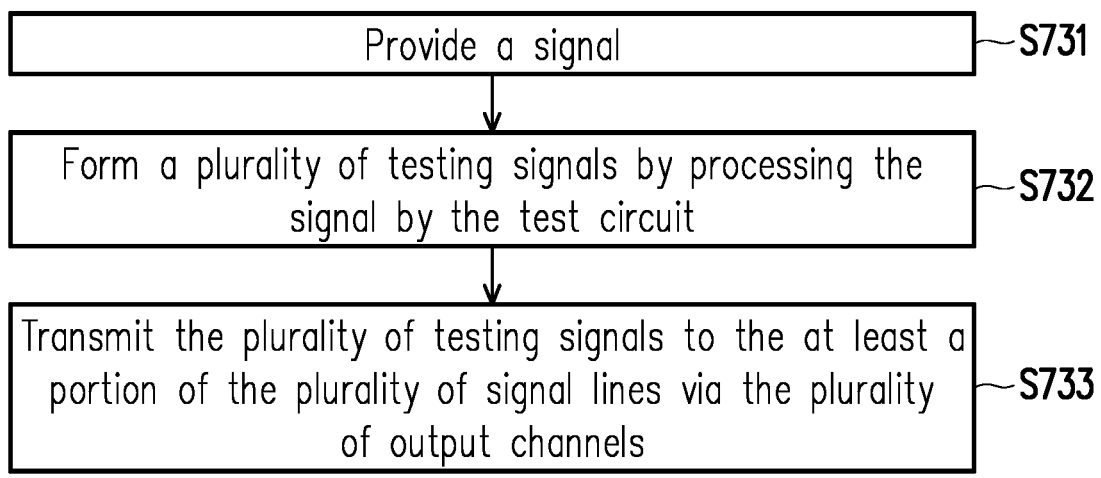
FIG. 7B is a flowchart of a testing method of an embodiment of the disclosure.

FIG. 7B is a flowchart of a testing method of an embodiment of the disclosure. Referring to FIG. 1A and FIG. 7A, the testing method of the present embodiment may be applicable to the electronic device 10 of FIG. 1A, and the testing method of the present embodiment may be a further description of step S730 of FIG. 7A. In step S731, the testing circuit 12 of the electronic device 10 is applied to a signal (the signal 111 of the signal source 110 of FIG. 1B). In step S732, the electronic device 10 processes the signal via the testing circuit 12 to form a plurality of testing signals. The testing circuit 12 may form a plurality of testing signals by controlling the on/off state of the plurality of switches of FIG. 1B and FIG. 3 to FIG. 5. In step S733, the testing circuit 12 transmits a plurality of testing signals to at least a portion of the plurality of signal lines via a plurality of output channels. The testing circuit 12 may output testing signals to corresponding signal lines and pixel array 13 via the plurality of output channels of FIG. 1B and FIG. 3 to FIG. 5. Therefore, the testing method of the present embodiment may effectively generate testing signals to perform a testing process on the signal lines and the pixel array 13.

In addition, for the method of the embodiment of FIG. 7A and FIG. 7B and other extended implementations, technical means, and technical content of the electronic device 10, reference may be made to the description of the embodiments of FIG. 1A to FIG. 6 to obtain sufficient teaching, suggestion, and implementation, and are therefore not repeated herein.

Based on the above, the electronic device of the disclosure may form a testing circuit to test the plurality of signal lines, so as to effectively test whether the plurality of signal lines are shortage or disconnected. Moreover, in some embodiments of the disclosure, the electronic device may also effectively reduce the circuit layout area occupied by the testing circuit on the substrate of the electronic device.

Lastly, it should be mentioned that: each of the above embodiments is used to describe the technical solutions of the disclosure and is not intended to limit the disclosure; and although the disclosure is described in detail via each of the above embodiments, those having ordinary skill in the art should understand that: modifications may still be made to the technical solutions recited in each of the above embodiments, or portions or all of the technical features thereof may be replaced to achieve the same or similar results; the modifications or replacements do not make the nature of corresponding technical solutions depart from the scope of the technical solutions of each of the embodiments of the disclosure.

What is claimed is:

1. A manufacturing method of an electronic device, comprising:
   providing a substrate;
   forming a plurality of signal lines and a testing circuit on the substrate, wherein the testing circuit comprises a plurality of output channels electrically connected to some of the plurality of signal lines, and the testing circuit comprises a plurality of switches and a plurality of sub-testing circuits, wherein the plurality of switches are connected to the plurality of signal lines via the plurality of sub-testing circuits;
   performing a testing process, comprising:
      providing a signal;
      processing the signal to form a plurality of testing signals by the testing circuit, comprising:
         turning on a first switch of the plurality of switches and turning off the other switches of the plurality of switches according to a plurality of control signals, wherein the first switch is electrically connected to the some of plurality of signal lines; and
      transmitting the plurality of testing signals to the some of the plurality of signal lines via the plurality of output channels; and
   optionally isolating the testing circuit from the some of the plurality of signal lines,
   wherein the overall plurality of output channels of the testing circuit are less than the overall plurality of signal lines in quantity.

2. The manufacturing method of claim 1, wherein the step of transmitting the plurality of testing signals is performed by transmitting the plurality of testing signals to a portion of the plurality of signal lines via the plurality of output channels.

3. The manufacturing method of claim 1, wherein the step of transmitting the plurality of testing signals is performed by transmitting the plurality of testing signals to all of the signal lines via the plurality of output channels.

4. The manufacturing method of claim 3, wherein the step of transmitting the plurality of testing signals is performed by transmitting one of the plurality of testing signals to three of the plurality of signal lines via one of the plurality of output channels.

5. The manufacturing method of claim 4, wherein the three of the plurality of signal lines are adjacent to each other.

6. The manufacturing method of claim 4, wherein the three of the plurality of signal lines are not adjacent to each other.

7. The manufacturing method of claim 1, wherein the step of optionally isolating the testing circuit from the some of the plurality of signal lines comprises:
   providing an isolation circuit on the substrate; and
   enabling the isolation circuit to isolate the testing circuit from the some of the plurality of signal lines.

8. The manufacturing method of claim 1, wherein the step of optionally isolating the testing circuit from the some of the plurality of signal lines comprises:
   cutting off the plurality of output channels from the some of the signal lines.

9. An electronic device, comprising:
   a plurality of signal lines; and
   a testing circuit, comprising a plurality of output channels electrically connected to some of the plurality of signal lines, a plurality of switches and a plurality of sub-testing circuits, wherein the plurality of switches are connected to the plurality of signal lines via the plurality of sub-testing circuits,
   wherein the overall plurality of output channels of the testing circuit are less than the overall plurality of signal lines in quantity,
   wherein a first switch of the plurality of switches is turned on and the other switches of the plurality of switches are turned off according to a plurality of control signals, wherein the first switch is electrically connected to the some of plurality of signal lines.

10. The electronic device of claim 9, wherein the testing circuit and the plurality of signal lines are isolated.

11. The electronic device of claim 9, wherein the testing circuit is electrically connected to some of the plurality of signal lines.

12. The electronic device of claim 9, wherein the testing circuit is electrically connected to the plurality of signal lines via some of the plurality of output channels.

13. The electronic device of claim 9, wherein the testing circuit provides a signal, the testing circuit processes the signal to form a plurality of testing signals, and the testing circuit transmits the plurality of testing signals to the some of the plurality of signal lines via the plurality of output channels wherein the testing circuit is optionally isolated from the some of the plurality of signal lines.

14. The electronic device of claim 13, wherein the testing circuit transmits the plurality of testing signals to a portion of the signal lines via the plurality of output channels.

15. The electronic device of claim 13, wherein the testing circuit transmits the plurality of testing signals to all of the signal lines via the plurality of output channels.

16. The electronic device of claim 15, wherein the testing circuit transmits one of the plurality of testing signals to three of the plurality of signal lines via one of the plurality of output channels.

17. The electronic device of claim 16, wherein the three of the plurality of signal lines are adjacent to each other.

18. The electronic device of claim 16, wherein the three of the plurality of signal lines are not adjacent to each other.

19. The electronic device of claim 9, further comprising:
   an isolation circuit, electrically connected to the test circuit and the some of the plurality of signal lines, and enabled to isolate the test circuit from the some of the plurality of signal lines.

20. The electronic device of claim 9, wherein the plurality of output channels are cut off to isolate the test circuit from the plurality of signal lines.

* * * * *